«12» United States Patent
Wu et al.

(10) Patent No.: US 12,281,186 B2
(45) Date of Patent: Apr. 22, 2025

(54) ETHYLENE/ALPHA-OLEFIN INTERPOLYMER BASED COMPOSITIONS WITH IMPROVED BALANCE OF CURE AND PROCESSABILITY

(71) Applicant: Dow Global Technologies LLC, Midland, MI (US)

(72) Inventors: Gaoxiang Wu, Pearland, TX (US); Brian M. Habersberger, Houston, TX (US); Hong Yang, Shanghai (CN); Johnathan E. DeLorbe, Manvel, TX (US); Thomas Wesley Karjala, Jr., Lake Jackson, TX (US)

(73) Assignee: Dow Global Technologies LLC, Midland, MI (US)

( * ) Notice: Subject to any disclaimer, the term of this patent is extended or adjusted under 35 U.S.C. 154(b) by 549 days.

(21) Appl. No.: 17/773,569

(22) PCT Filed: Dec. 26, 2019

(86) PCT No.: PCT/CN2019/128576
§ 371 (c)(1),
(2) Date: Apr. 29, 2022

(87) PCT Pub. No.: WO2021/128128
PCT Pub. Date: Jul. 1, 2021

(65) Prior Publication Data
US 2022/0380497 A1    Dec. 1, 2022

(51) Int. Cl.
C08L 23/06    (2006.01)
C08F 210/16   (2006.01)
(Continued)

(52) U.S. Cl.
CPC ............ *C08F 210/16* (2013.01); *C08J 3/24* (2013.01); *C08J 5/18* (2013.01); *C08K 5/14* (2013.01);
(Continued)

(58) Field of Classification Search
CPC ...... C08L 23/06; C08L 23/08; C08L 23/0807; C08L 23/0815; C08L 23/26; C08L 2203/16; C08L 2203/206; C08K 5/14; C08K 5/54
See application file for complete search history.

(56) References Cited

U.S. PATENT DOCUMENTS 5,849,823 A    12/1998  Kale et al.
6,369,176 B1    4/2002  Laughner et al.
(Continued)

FOREIGN PATENT DOCUMENTS

CN    104263258 A    1/2015
CN    105950039 A    9/2016
(Continued)

OTHER PUBLICATIONS

PCT/CN2019/128576, International Search Report and Written Opinion with a mailing date of Aug. 31, 2020.

*Primary Examiner* — Rip A Lee
(74) *Attorney, Agent, or Firm* — Karen L. Beckman

(57) ABSTRACT

A composition comprising the following components a)-c): a) an alpha composition comprising a multimodal ethylene/alpha-olefin interpolymer, and wherein the alpha composition comprises the following properties: i) an Mz/Mn≥8.0, ii) a density from 0.855 to 0.890 g/cc, iii) a V100 (100° C.)≤2,000 Pa·s, iv) a V1.0 (100° C.)≥15,000 Pa·s, v) a Mn≥16,000 g/mol; b) a peroxide; and c) a silane coupling agent.

20 Claims, 1 Drawing Sheet

(51) Int. Cl.
  *C08J 3/24* (2006.01)
  *C08J 5/18* (2006.01)
  *C08K 5/14* (2006.01)
  *C08K 5/54* (2006.01)
  *C08L 23/08* (2025.01)
  *H10F 19/80* (2025.01)
  *H10F 71/00* (2025.01)
  *C08L 23/0807* (2025.01)

(52) U.S. Cl.
  CPC .............. *C08K 5/54* (2013.01); *C08L 23/06* (2013.01); *H10F 19/804* (2025.01); *H10F 71/00* (2025.01); *C08F 2810/20* (2013.01); *C08J 2323/16* (2013.01); *C08L 23/0807* (2013.01); *C08L 23/0815* (2013.01)

(56) References Cited

U.S. PATENT DOCUMENTS

| | | | |
|---|---|---|---|
| 6,451,894 B1 | 9/2002 | Srinivasan et al. | |
| 8,581,094 B2 | 11/2013 | Patel et al. | |
| 8,697,984 B2 | 4/2014 | Amamiya et al. | |
| 8,772,625 B2* | 7/2014 | Ikenaga | C09D 123/0815 |
| | | | 526/348 |
| 9,029,487 B2 | 5/2015 | Klosin et al. | |
| 9,349,895 B2* | 5/2016 | Ikenaga | C08L 23/0815 |
| 9,428,636 B2* | 8/2016 | Effler | C08F 10/02 |
| 9,587,094 B2 | 3/2017 | Maeyama et al. | |
| 9,975,975 B2 | 5/2018 | Ewart et al. | |
| 10,030,085 B2 | 7/2018 | Amamiya et al. | |
| 11,193,010 B2* | 12/2021 | He | C08K 5/5419 |
| 12,129,368 B2* | 10/2024 | Munro | C08F 10/00 |
| 12,180,314 B2* | 12/2024 | Munro | C08K 5/09 |
| 2011/0290317 A1 | 12/2011 | Naumovitz et al. | |
| 2012/0000514 A1 | 1/2012 | Amamiya et al. | |
| 2013/0087198 A1 | 4/2013 | Naumovitz et al. | |
| 2013/0087199 A1* | 4/2013 | Naumovitz | H10F 19/804 |
| | | | 361/746 |
| 2013/0233383 A1 | 9/2013 | Naumovitz et al. | |
| 2013/0324671 A1 | 12/2013 | Kataoka et al. | |
| 2015/0274867 A1 | 10/2015 | LiPiShan et al. | |
| 2016/0115264 A1 | 4/2016 | Rohatgi et al. | |
| 2017/0005214 A1 | 1/2017 | Yoshitake et al. | |
| 2019/0276573 A1 | 9/2019 | Carnahan et al. | |

FOREIGN PATENT DOCUMENTS

| | | |
|---|---|---|
| CN | 106189932 A | 12/2016 |
| CN | 106811150 A | 6/2017 |
| EP | 2637217 B1 | 3/2016 |
| EP | 2958151 B1 | 10/2018 |
| JP | 2012009688 A | 1/2012 |
| JP | 2012044153 A | 3/2012 |
| WO | 02074817 | 9/2002 |
| WO | 2018022975 | 2/2018 |
| WO | 2021128127 | 7/2021 |
| WO | 2021133613 | 7/2021 |
| WO | 2021133640 | 7/2021 |

* cited by examiner

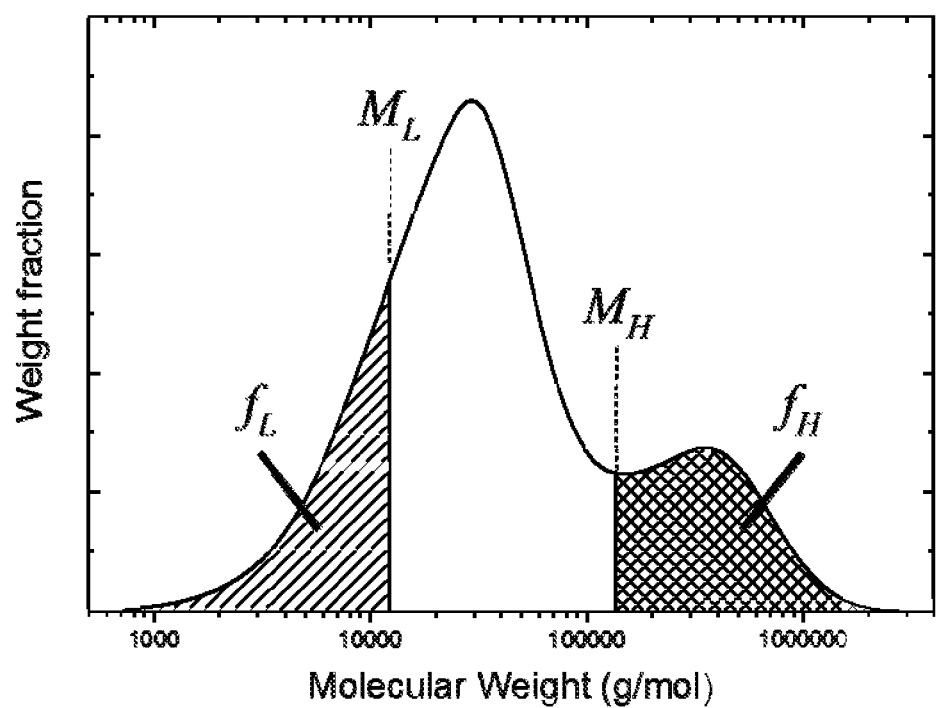

ETHYLENE/ALPHA-OLEFIN INTERPOLYMER BASED COMPOSITIONS WITH IMPROVED BALANCE OF CURE AND PROCESSABILITY

BACKGROUND OF THE INVENTION

Materials designed for photovoltaic encapsulants must satisfy many requirements. In order to prevent movement of electrical components and wiring, within a photovoltaic module, polymeric encapsulating materials must not flow significantly at temperatures up to 85° C. One way to accomplish this, is to use a semicrystalline polymer with a melting point above this temperature. However, other encapsulating material requirements, such as high optical clarity and low modulus, are optimized with low-crystallinity polymers. To balance these requirements, typically a low-crystallinity polymer, such as an ethylene-vinyl acetate copolymer (EVA) or a polyolefin elastomer (POE), such as an ENGAGE Polyolefin Elastomer, is used in conjunction with a peroxide-based reactive curing formulation. The low crystallinity polymer provides high clarity and low modulus, while the curing formulation facilitates a crosslinking reaction, which causes the polymer to form a network, providing mechanical stability at high temperatures. This crosslinking reaction takes place during module lamination, typically conducted at 150° C.

If a peroxide curing formulation is used, the film extrusion process must be conducted at a low temperature, in order to prevent the peroxide from decomposing and initiating the crosslinking reaction in the extruder. Heat generated during extrusion is related to the rate of extrusion and the polymer viscosity; high viscosity and high extrusion rates generate more heat. Therefore, to extrude a "peroxide-curing" encapsulant film, a low viscosity resin, extruded at low rates, is preferred. However, low extrusion rates are economically disadvantageous, and low viscosity is typically achieved via the use of a low molecular weight resin. Low molecular weight resins cannot be crosslinked efficiently, and require a higher loading of the peroxide curing formulation, or longer times in the module lamination process, in order to reach the necessary level of crosslinking. Both solutions are costly and inefficient.

Thus, the design of a photovoltaic encapsulant requires a balance between curing performance, which is optimized at the high molecular weight (typically accompanied by a high viscosity), and extrusion performance, which is optimized at the low molecular weight. There is a need for new polymer compositions that provide both high levels of cure and good processability. U.S. Publication 2011/0290317 describes an electrical device (for example, a solar cell), in which an ethylene-based polymer composition is used as an encapsulant. The ethylene-based polymer composition can have a bimodal or a multimodal molecular weight distribution. Other polyolefin encapsulating compositions are described in the following references: U.S. Pat. No. 8,581,094 (polyolefin copolymer based composition), U.S. Pat. No. 8,697,984 (ethylene/alpha-olefin copolymer based compositions), U.S. Pat. No. 9,349,895 (ethylene/alpha-olefin copolymer based compositions). However, the compositions of the art do not advance an optimum balance of cure and processability. As discussed, there remains a need for new polymer compositions that provide both high levels of cure and good processability. This need has been met by the following invention.

SUMMARY OF THE INVENTION

A composition comprising the following:
a) an alpha composition comprising a multimodal ethylene/alpha-olefin inter polymer, and wherein the alpha composition comprises the following properties:
   i) an $Mz/Mn \geq 8.0$,
   ii) a density from 0.855 to 0.890 g/cc,
   iii) a V100 (100° C.)$\leq$2,000 Pa·s,
   iv) a V1.0 (100° C.)$\geq$15,000 Pa·s,
   v) a $Mn \geq 16,000$ g/mol;
b) a peroxide; and
c) a silane coupling agent.

BRIEF DESCRIPTION OF THE DRAWINGS

FIG. 1 is a GPC chromatograph of multimodal interpolymer (alpha comp. POE B).

DETAILED DESCRIPTION OF THE INVENTION

Compositions have been discovered that have excellent shear-thinning behavior for excellent processability, and have improved curing performance at equivalent viscosity, or, alternatively, improve viscosity at equivalent curing performance (each with respect to conventional polyolefin-based compositions).

As discussed, a composition is provided, which comprises the following:
a) an alpha composition comprising a multimodal ethylene/alpha-olefin interpolytner, and wherein the alpha composition comprises the following properties:
   i) an $Mz/Mn \geq 8.0$,
   ii) a density from 0.855 to 0.890 g/cc,
   iii) a V100 (100° C.)$\leq$2,000 Pa·s,
   iv) a V1.0 (100° C.)$\geq$15,000 Pa·s,
   v) a $Mn \geq 16,000$ g/mol;
b) a peroxide; and
c) a silane coupling agent.

In one embodiment, or a combination of two or more embodiments, each described herein, the alpha composition has a $Mz/Mn \geq 8.5$, or $\geq 9.0$, or $\geq 9.5$, or $\geq 10.0$, or $\geq 11.0$; or $\geq 12.0$, or $\geq 13.0$, or $\geq 14.0$, or $\geq 15.0$. In one embodiment, or a combination of two or more embodiments, each described herein, the alpha composition has a $Mz/Mn \leq 60.0$, or $\leq 55.0$, or $\leq 50.0$.

In one embodiment, or a combination of two or more embodiments, each described herein, the alpha composition has a density $\geq 0.856$ g/cc, or $\geq 0.857$ g/cc, or $\geq 0.858$ g/cc, or $\geq 0.859$ g/cc, or $\geq 0.860$ g/cc, or $\geq 0.861$ g/cc, or $\geq 0.862$ g/cc, or $\geq 0.863$ g/cc, or $\geq 0.864$ g/cc, or $\geq 0.865$ g/cc, or $\geq 0.866$ g/cc, or $\geq 0.867$ g/cc, or $\geq 0.868$ g/cc, or $\geq 0.869$ g/cc, or % 0.870 g/cc (1 cc=1 cm$^3$). In one embodiment, or a combination of two or more embodiments, each described herein, the alpha composition has a density $\leq 0.889$ glee; or $\leq 0.888$ g/cc, or $\leq 0.887$ g/cc, or $\leq 0.886$ g/cc, or $\leq 0.885$ g/cc, or $\leq 0.884$ g/cc, or $\leq 0.883$ g/cc, or $\leq 0.882$ g/cc.

In one embodiment; or a combination of two or more embodiments, each described herein, the alpha composition has a N/100 (100 rad/s, 100° C.)$\geq$500 Pa·s, or $\geq$550 Pa·s, or % 600 Pa·s, or $\geq$650 Pa·s, or $\geq$700 Pa·s, or $\geq$750 Pa·s, or $\geq$800 Pa·s, or $\geq$850 Pa·s, or $\geq$900 Pa·s. In one embodiment, or a combination of two or more embodiments, each described herein, the alpha composition has a V100 (100 rad/s, 100° C.)$\leq$1,950 Pa·s, or $\leq$1,900 Pa·s, or $\leq$1,880 Pa·s, or $\leq$1,860 Pa·s, $\leq$ or 1,840 Pa·s, or $\leq$1,820 Pa·s, or $\leq$1,800 Pa·s, or $\leq$1,780 Pa·s.

In one embodiment, or a combination of two or more embodiments, each described herein, the alpha composition has a V1.0 (1.0 rad/s, 100° C.)≥15,200 Pa·s, or ≥15,500 Pa·s, or ≥16,000 Pa·s, or ≥16; 200 Pa, or ≥17; 000 Pa·s; or ≥18,000 Pa·s, or ≥19,000 Pa·s, or ≥20,000 Pa·s, or ≥21,000 Pa·s, or ≥22,000 Pa·s, or ≥23,000 Pa·s, or ≥24,000 Pa·s, or % 25,000 Pa·s. In one embodiment, or a combination of two or more embodiments, each described herein, the alpha composition has a V1.0 (1.0 rad/s, 100° C.)≤250,000 Pa·s, or ≤200,000 Pa·s, or ≤150,000 Pa·s, or ≤120,000 Pa·s, ≤ or 100,000 Pa·s, or ≤80,000 Pa·s, or 60,000 Pa·s, or ≤50,000 Pa·s, or ≤45,000 Pa·s, or ≤40,000 Pa·s, or ≤38,000 Pa·s.

In one embodiment, or a combination of two or more embodiments, each described herein, the alpha composition has a melt index (I2) ≥1.0 g/10 min, or ≥1.1 g/10 min, or ≥1.2 g/10 min, or ≥1.3 g/10 min, or ≥1.4 g/10 min, or ≥1.6 g/10 min, or ≥1.8 g/10 min, or ≥2.0 g/10 min. In one embodiment, or a combination of two or more embodiments, each described herein, the alpha composition has a melt index (I2) ≤30 g/10 min, or ≤28 g/10 min, or ≤26 g/10 min, or ≤24 g/10 min, or ≤22 g/10 min, or ≤20 g/10 min, or ≤18 g/10 min, or ≤16 g/10 min, or ≤14 g/10 min, or ≤12 g/10 min, or ≤10 g/10 min, or ≤8.0 g/10 min, or 6.0 g/10 min, or ≤5.0 g/10 min.

In one embodiment, or a combination of two or more embodiments, each described herein, the alpha composition has an I10/I2≥6.0, or ≥6.5, or ≥7.0, or ≥7.5, or ≥8.0, or ≥8.5, or ≥9.0, or ≥9.5, or ≥10.0, or ≥10.5, or ≥11.0, or ≥11.5, or ≥12.0, or ≥12.5, or ≥13.0, or ≥13.5, or ≥14.0, or ≥14.5, or ≥15.0. In one embodiment, or a combination of two or more embodiments, each described herein, the alpha composition has an I10/I2≤40.0, or ≤35.0, or ≤32.0, or ≤30.0 or ≤28.0, or ≤26.0, or ≤24.0.

In one embodiment, or a combination of two or more embodiments, each described herein, the alpha composition has a molecular weight distribution MWD≥3.00, or ≥3.05, or ≥3.10, or ≥3.20, or ≥3.30, or ≥3.40, or ≥3.50, or ≥3.60, or ≥3.70, or ≥3.80, or ≥3.90, or ≥4.00, or ≥4.10, or ≥4.20, or ≥4.30, or ≥4.40, or ≥4.50, or ≥4.60, or ≥4.70, or ≥4.80, or ≥4.90, or ≥5.00, or ≥5.10 In one embodiment, or a combination of two or more embodiments, each described herein, the alpha composition has a molecular weight distribution MWD ≤8.00, or ≤7.50, or ≤7.00, or ≤6.90, or ≤6.80, or ≤6.70, or ≤6.60, or ≤6.50, or ≤6.40, or ≤6.30.

In one embodiment, or a combination of two or more embodiments, each described herein, the alpha composition has a number average molecular weight Mn≥16,200 g/mol, or ≥16,400 g/mol, or ≥16,600 g/mol, or ≥16,800 g/mol, or ≥17,000 g/mol, or ≥17,200 g/mol, or ≥17,400 g/mol. In one embodiment, or a combination of two or more embodiments, each described herein, the alpha composition has a number average molecular weight Mn≤50,000 g/mol, or ≤45,000 g/mol, or ≤40,000 g/mol, or ≤38,000 g/mol, or ≤36,000 g/mol, or ≤34,000 g/mol, or ≤32,000 g/mol, or ≤30,000 g/mol.

In one embodiment, or a combination of two or more embodiments, each described herein, for the multimodal ethylene/alpha-olefin interpolymer, the ratio [$Mn_{(highest\ 20\%\ mass\ fraction)}/Mn_{(lowest\ 20\%\ mass\ fraction)}$]≥16.0, or ≥16.5, or ≥17.0, or ≥17.5, or ≥18.0, or ≥ or 18.5, or ≥19.0, or ≥19.5, or ≥20.0. In one embodiment, or a combination of two or more embodiments, each described herein, for the multimodal ethylene/alpha-olefin interpolymer, the ratio [$Mn_{(highest\ 20\%\ mass\ fraction)}/Mn_{lowest\ 20\%\ mass\ fraction}$]≤100.0, or ≤90.0, or ≤80.0, or ≤75.0, or ≤70.0, or ≤65.0, or ≤60.0, or ≤55.0.

In one embodiment, or a combination of two or more embodiments, each described herein, the multimodal ethylene/alpha-olefin interpolymer comprises a first ethylene/alpha-olefin interpolymer fraction and a second ethylene/alpha-olefin interpolymer fraction, and where the first fraction differs from the second fraction in one or more polymer properties. In one embodiment, or a combination of two or more embodiments, each described herein, the first ethylene/alpha-olefin interpolymer fraction differs from the second ethylene/alpha-olefin interpolymer fraction in one or more properties selected from comonomer content, I2, I10/I2, Mn, Mw, Mz, MWD, or any combination thereof.

In one embodiment, or a combination of two or more embodiments, each described herein, the first ethylene/alpha-olefin interpolymer fraction is a first ethylene/alpha-olefin copolymer. In one embodiment, or a combination of two or more embodiments, each described herein, the second ethylene/alpha-olefin interpolymer fraction is a second ethylene/alpha-olefin copolymer.

In one embodiment, or a combination of two or more embodiments, each described herein, the composition comprises ≥50.0 wt %, or ≥55.0 wt %, or ≥60.0 wt %, or ≥65.0 wt %, or ≥70.0 wt %, or ≥75.0 wt %, or ≥80.0 wt %, or ≥85.0 wt %, or ≥90.0 wt % of the alpha composition, based on the weight of the composition. In one embodiment, or a combination of two or more embodiments, each described herein, the composition comprises ≥95.0 wt %, or ≥95.5 wt %, or ≥96.0 wt %, or ≥96.5 wt %, or ≥97.0 wt %, or ≥97.5 wt %, or ≥98.0 wt %, or ≥98.1 wt % of the alpha composition, based on the weight of the composition. In one embodiment, or a combination of two or more embodiments, each described herein, the composition comprises ≤99.8 wt %, ≤99.6 wt %, or ≤99.4 wt %, or ≤99.2 wt %, or ≤99.0 wt %, or ≤98.8 wt %, or ≤98.6 wt %, or ≤98.4 wt %, or ≤98.3 wt % of the alpha composition, based on the weight of the composition.

In one embodiment, or a combination of two or more embodiments, each described herein, the alpha composition further comprises a unimodal ethylene/alpha-olefin interpolymer that has a MWD from 1.80 to 2.50, or from 1.85 to 2.45, or from 1.90 to 2.40. In one embodiment, or a combination of two or more embodiments, each described herein, the unimodal ethylene/alpha-olefin interpolymer has a density from 0.860 to 0.890 g/cc, or from 0.865 to 0.888 g/cc, or from 0.865 to 0.885 glee. In one embodiment, or a combination of two or more embodiments, each described herein, the unimodal ethylene/alpha-olefin interpolymer has a melt index (I2) from 0.2 to 10 g/10 min, or from 0.3 to 5.0 g/10 min, or from 0.4 to 2.0 g/10 min.

In one embodiment, or a combination of two or more embodiments, each described herein, the alpha composition comprises ≥10.0 wt %, or ≥12.0 wt %, or ≥14.0 wt %, or ≥16.0 wt %, or ≥17.0 wt %, or ≥18.0 wt % of the unimodal ethylene/alpha-olefin interpolymer, based on the weight of the alpha composition. In one embodiment, or a combination of two or more embodiments, each described herein, the alpha composition comprises ≤40.0 wt %, or ≤35.0 wt %, or ≤30.0 wt %, or ≤28.0 wt %, or ≤26.0 wt %, or ≤24.0 wt %, or ≤22.0 wt %, or ≤20.0 wt % of the unimodal ethylene/alpha-olefin interpolymer, based on the weight of the alpha composition.

In one embodiment, or a combination of two or more embodiments, each described herein, the weight ratio of the multimodal ethylene/alpha-olefin interpolymer to the unimodal ethylene/alpha-olefin interpolymer is ≥2.0, or ≥2.5, or ≥3.0, or ≥3.5, or ≥4.0. In one embodiment, or a combination of two or more embodiments, each described herein, the weight ratio of the multimodal ethylene/alpha-olefin interpolymer to the unimodal ethylene/alpha-olefin interpolymer is ≤7.0, or ≤6.5, or ≤6.0, or 5.5, or 5.0, or ≤4.5.

In one embodiment, or a combination of two or more embodiments, each described herein, the weight ratio of the peroxide to the slime coupling agent is ≥0.5, or ≥1.0, or ≥, or ≥2.0, or ≥2.5, or ≥3.0, or ≥3.5, or ≥4.0. In one embodiment, or a combination of two or more embodiments, each described herein, the weight ratio of the peroxide to the silane coupling agent is ≤7.0, or ≤6.5, or ≤6.0, or ≤5.5, or ≤5.0, or ≤4.5.

In one embodiment, or a combination of two or more embodiments, each described herein, the composition further comprises a crosslinking coagent. In one embodiment, or a combination of two or more embodiments, each described herein, the weight ratio of the peroxide to the coagent is ≥0.5, or ≥0.8, or ≥1.0, or ≥1.1, or ≥1.2, or ≥1.3, or ≥1.4, or ≥1.5, or ≥1.6, or ≥1.8. In one embodiment, or a combination of two or more embodiments, each described herein, the weight ratio of the peroxide to the coagent is 3.0, or 2.8, or 2.6, or ≤2.4, or ≤2.3, or ≤2.2, or ≤2.0.

In one embodiment, or a combination of two or more embodiments, each described herein, the weight ratio of the coagent to the "silane coupling agent is ≥1.0, or ≥1.2, or ≥1.4, or ≥1.6, or ≥1.8, or ≥2.0. In one embodiment, or a combination of two or more embodiments, each described herein, the wherein the weight ratio of the coagent to the silane coupling agent is ≤3.6, or ≤3.4, or ≤3.2, or ≤3.0, or ≤2.8, or ≤2.6, or ≤2.4.

In one embodiment, or a combination of two or more embodiments, each described herein, the composition comprises ≥99.0 wt %, or ≥99.1 wt %, or ≥99.2 wt %, or ≥99.3 wt %, or ≥99.4 wt % of the sum of components a)-c), based on the weight of the composition. In one embodiment, or a combination of two or more embodiments, each described herein, the composition comprises ≤100.0 wt %, or ≤99.9 wt %, ≤99.8 wt %, or ≤99.7 wt %, or ≤99.6 wt %, or ≤99.5 wt % of the sum of components a)-c), based on the weight of the composition.

The invention also provides a crosslinked composition formed from the composition of any one embodiment, or a combination of two or more embodiments, each described herein.

The invention also provides an article comprising at least one component formed from the composition of any one embodiment, or a combination of two or more embodiments, each described herein. In one embodiment, or a combination of two or more embodiments, each described herein, the article is a film, and further an extruded and/or a cast film. In another embodiment, the article is a solar cell module.

The invention also provides a process of forming a solar cell module, said process comprising laminating an array of solar cells between two film layers, and wherein each film layer is, independently, formed from the composition of any one embodiment, or a combination of two or more embodiments, each described herein. In a further embodiment, each film layer is formed from the same composition.

The inventive composition may comprise a combination of two or more embodiments, as described herein. The alpha composition may comprise a combination of two or more embodiments, as described herein. Each interpolymer fraction may independently comprise a combination of two or more embodiments, as described herein. The peroxide may comprise a combination of two or more embodiments, as described herein. The silane coupling agent may comprise a combination of two or more embodiments, as described herein.

Preferably the multimodal ethylene/alpha-olefin interpolymer comprises at least two ethylene/alpha-olefin interpolymer fractions. Eachethylene/alpha-olefin interpolymer fraction, independently, comprises, in polymerize form, ethylene, and an alpha-olefin, and optionally may comprise a polyene, and further a nonconjugated polyene. The alpha-olefin may be either an aliphatic or an aromatic compound. The alpha-olefin is preferably a C3-C20 aliphatic compound; preferably a C3-C16 aliphatic compound, and more preferably a C3-C10 aliphatic compound. Preferred C3-C10 aliphatic alpha-olefins include propylene, 1-butene, 1-hexene, 1-octene and 1-decene, and more preferably 1-octene. Suitable examples of nonconjugated polyenes include straight chain acyclic dienes, such as 1,4-hexadiene and 1,5-heptadiene; branched chain acyclic dienes, such as 5-methyl-1,4-hexadiene, 2-methyl-1,5-hexadiene; 6-methyl-1,5-heptadiene, 7-methyl-1,6-octadiene, 3,7-dimethyl-1,6-octadiene, 3,7-dimethyl-1,7-octadiene, 5,7-dimethyl-1,7-octadiene, 1,9-deca-diene, and mixed isomers of dihydromyrcene; single ring alicyclic dienes such as 1,4-cyclo-hexadiene, 1,5-cyclooctadiene and 1,5-cyclodo-deca-diene; multi-ring alicyclic fused and bridged ring dienes, such as tetrahydroindene; methyl tetrahydroindene; alkenyl; alkylidene; cycloalkenyl and cycloalkylidene norbornenes such as 5-methylene-2-norbornene (MNB), 5-ethylidene-2-norbornene (ENB), 5-vinyl-2-norbornene (VNB), 5-propenyl-2-norbornene, 5-isopropyli-dene-2-norbornene, 5-(4-cyclopentenyl)-2-norbornene, and 5-cyclohexylidene-2-norbornene. The polyene is preferably a nonconjugated diene selected from ENB, VNB and dicyclopenta-diene, and more preferably ENB.

Peroxides (containing at least one "—O—O—" group), are preferably organic peroxides, such as, for example, t-butylperoxy-2-ethylhexyl carbonate; di-t-butyl peroxide; t-butyl-cumyl peroxide; dicumyl peroxide; 2,5-dimethyl-2,5-di-(t-butylperoxy) hexane; di-(t-butylperoxy-isopropyl) benzene; t-butyl peroxybenzoate; 1,1-di-(t-butylperoxy)-3,3,5-trimethyl-cyclohexane; 2,5-dimethyl-2,5-di(t-amylperoxy)-hexane; 2,5-dimethyl-2, 5-di(t-butyl-peroxy)hexyne-3, 2,5-dimethyl-2,5-di(t-amylperoxy)hexyne-3; di-t-amyl peroxide; 1,3-dimethyl-3-(t-butyl-peroxy)butanol; 1,3-dimethyl-3-(t-amylperoxy)butanol; and mixtures of two or more of these initiators. See, for example, TRIGONOX peroxides from AkzoNobel, LUPEROX peroxides from ARKEMA.

Silane coupling agents include, but are not limited to, vinyltrimethoxysilane and 3-(trimethoxysilyl) propyltnethacrylate. Crosslinking coagents include, but are not limited to, triallyl cyanurate, triallyl phosphate, triallyl isocyanurate, and 1,3,5,7-tetravinyl-1,3,5,7-tetramethylcyclotetrasiloxane. An inventive composition may also comprise one or more additives, such as UV stabilizers, antioxidants, and combinations thereof.

In one embodiment, or a combination of two or more embodiments; each described herein, an inventive composition further comprises a thermoplastic polymer, different from the interpolymer of component a), in one or more features, such as monomer(s) types and/or amounts, Mn, Mw, Mz, MWD, Mooney Viscosity, V1 V100, RR, or any combination thereof. Polymers include, but not limited to, ethylene-based polymers, propylene-base polymers, and olefin multi-block interpolymers. Suitable ethylene-base polymers include, but are not limited to, high density polyethylene (HDPE), linear low density polyethylene (LLDPE), very low density polyethylene (VLDPE), ultra-low density polyethylene (ULDPE), homogeneously branched linear ethylene-based polymers, and homogeneously branched substantially linear ethylene-based polymers (that is homogeneously branched, long chain branched ethylene polymers). Suitable propylene-base polymers include, but are not limited to, polypropylene homopolymers and propylene/ethylene copolymers.

Definitions

Unless stated to the contrary, implicit from the context, or customary in the art, all parts and percents are based on weight, and all test methods are current as of the filing date of this disclosure.

The term "composition," as used herein, includes a mixture of materials, which comprise the composition, as well as reaction products and decomposition products formed from the materials of the composition. Any reaction product or decomposition product is typically present in trace or residual amounts.

The term "polymer," as used herein, refers to a polymeric compound prepared by polymerizing monomers, whether of the same or a different type. The generic term polymer thus, includes the term homopolymer (employed to refer to polymers prepared from only one type of monomer, with the understanding that trace amounts of impurities can be incorporated into the polymer structure), and the term interpolymer as defined hereinafter. Trace amounts of impurities, such as catalyst residues, can be incorporated into and/or within the polymer. Typically, a polymer is stabilized with very low amounts ("ppm" amounts) of one or more stabilizers.

The term "interpolymer," as used herein, refers to polymer prepared by the polymerization of at least two different types of monomers. The term interpolymer thus includes the term copolymer (employed to refer to polymers prepared from two different types of monomers) and polymers prepared from more than two different types of monomers.

The term "propylene-based polymer," as used herein, refers to a polymer that comprises, in polymerized form, a majority weight percent of propylene (based on the weight of the polymer), and optionally may comprise one or more comonomers.

The term "ethylene-based polymer," as used herein, refers to a polymer that comprises, in polymerized form, 50 wt % or a majority weight percent of ethylene (based on the weight of the polymer), and optionally may comprise one or more cotnonomers.

The term "ethylene/alpha-olefin interpolymer," as used herein, refers to a random interpolytner that comprises, in polymerized form, ethylene, an alpha-olefin. In one embodiment, the "ethylene/alpha-olefin interpolymer," comprises, in polymerized form, 50 wt % or a majority weight percent of ethylene (based on the weight of the interpolymer).

The term "ethylene/alpha-olefin/nonconjugated polyene interpolymer," as used herein, refers to a random interpolymer that comprises, in polymerized form, ethylene, an alpha-olefin, and a nonconjugated polyene (for example, a nonconjugated diene), In one embodiment, the "ethylene/alpha-olefin/nonconjugated polyene interpolymer," comprises, in polymerized form, 50 wt % or a majority weight percent of ethylene (based on the weight of the interpolymer).

The term, "ethylene/alpha-olefin copolymer," as used herein, refers to a random copolymer that comprises, in polymerized form, 50 wt % or a majority amount of ethylene monomer (based on the weight of the copolymer), and an alpha-olefin, as the only two monomer types.

The term "multimodal" in the polymer term "multimodal ethylene/alpha-olefin interpolymer," as used herein, refers to an interpolymer that has a broad molecular weight distribution (MWD≥3.0). This broad MWD typically results from multiple interpolymer fractions present in the multimodal interpolymer, Each fraction, for example, may result from the use of a different catalyst, a different catalyst configuration, or a different reactor condition, each in a polymerization process. For example, the use of two catalysts in a one reactor, during a polymerization process to form two interpolymer fractions (an in-situ blend). Each fraction may also result from a polymer component of a physical blend of multiple ethylene/alpha-olefin interpolymers, or a polymer product from a post-reactor chemical reaction to polymers, such as a reactive extrusion process. The multimodal ethylene/alpha-olefin interpolymer has a molecular weight distribution (Mw/Mn)≥3.0, preferably ≥3.5, more preferably ≥4.0. In one embodiment, the multimodal ethylene/alpha-olefin interpolymer is formed from the use of two catalysts in one reactor; or from a single catalyst used in different polymerization conditions; or from two catalysts, each used in a different polymerization condition; or from the product of a physical blend. In a further embodiment, the multimodal ethylene/alpha-olefin interpolymer is formed from the use of two catalysts in one reactor; or from a single catalyst used in different polymerization conditions; or from two catalysts; each used in a different polymerization condition; and further from the use of two catalysts in one reactor.

The term "unimodal" in the polymer term "unimodal ethylene/alpha-olefin interpolymer," as used herein, refers to an interpolymer comprising only one ethylene/alpha-olefin interpolymer fraction (or interpolymer). This unimodal interpolymer has a narrow molecular weight distribution (MWD <3.0, and typically ≤2.5).

The term "silane coupling agent," as used herein, refers to a compound containing at least one "Si" atom and at least one "—$CH_2$—" group; and/or and at least one "—$CH_3$" group, and which compound forms a chemical link between two materials; for example, between a polymer and an inorganic material.

The term "solar cell (or photovoltaic cell)," as used herein, refers to a device that converts solar radiation into electricity. Solar cells are typically presented in an array pattern.

The term "solar cell module (or solar panel or solar module)," as used herein, refers to a photovoltaic panel which comprises an assembly of solar cells.

The term "laminating, lamination, and similar terms," as used herein, refer to the process in which multiple layered materials are bonded together under conditions comprising heat and pressure, and an optional vacuum.

The terms "comprising," "including," "having," and their derivatives, are not intended to exclude the presence of any additional component, step or procedure, whether the same is specifically disclosed. In order to avoid any doubt, all compositions claimed through use of the term "comprising" may include any additional additive, adjuvant, or compound, whether polymeric or otherwise, unless stated to the contrary. In contrast, the term, "consisting essentially of" excludes from the scope of any succeeding recitation any other component, step or procedure, excepting those that are not essential to operability. The term "consisting of" excludes any component, step or procedure, not specifically delineated or listed.

Listing of Some Composition Features

A] A composition comprising the following components a)-c):

a) an alpha composition comprising a multimodal ethylene/alpha-olefin interpolymer, and wherein the alpha composition comprises the following properties:
  i) an Mz/Mn≥8.0,
  ii) a density from 0.855 to 0.890 g/cc, iii) a V100 (100° C.)≤2,000 Pa·s,
iv) a V1.0 (100° C.)≥15,000 Pa·s,
v) a Mn≥16,000 g/mol;
b) a peroxide; and
c) a silane coupling agent.

B] The composition of A] above, wherein the alpha composition has a Mz/Mn≥8.5, or ≥9.0, or ≥9.5, or ≥10.0; or ≥11.0, or ≥12.0, or ≥13.0, or ≥14.0, or ≥15.0.

C] The composition of A] or B] above, wherein the alpha composition has a Mz/Mn 60.0, or ≤55.0, or ≤50.0.

D] The composition of any one of A]-C] (A through C) above, wherein the alpha composition has a density ≥0.856 g/cc, or ≥0.857 g/cc, or ≥0.858 g/cc, or ≥0.859 g/cc, or ≥0.860 g/cc, or ≥0.861 g/cc, or ≥0.862 g/cc, or ≥0.863 g/cc, or ≥0.864 g/cc, or ≥0.865 g-ee, or ≥0.866 g/cc, or ≥0.867 g/cc, or ≥0.868 g/cc, or ≥0.869 g/cc, or ≥0.870 g/cc (1 cc=1 cm³).

E] The composition of any one of A]-D] above, wherein the alpha composition has a density ≤0.889 g/cc, or ≤0.888 g/cc, or ≤0.887 g/cc, or ≤0.886 g/cc, or ≤0.885 g/cc, or 0.884 g/cc, or ≤0.883 g/cc, or ≤0.882 g/cc.

F] The composition of any one of A]-E] above, wherein the alpha composition has a V100 (100 rad/s, 100° C.)≥500 Pa·s, or ≥550 Pa·s, or ≥600 Pa·s, or ≥650 Pa·s, or ≥700 Pa·s, or ≥750 Pa·s; or ≥800 Pa·s, or ≥850 Pa·s; or ≥900 Pa·s.

G] The composition of any one of A]-F] above, wherein the alpha composition has a V100 (100 rad/s, 100° C.)≤1,950 Pa·s, or ≤1,900 Pa·s, or ≤1,880 Pa·s, or ≤1,860 Pa·s, ≤ or 1,840 Pa·s, or ≤1,820 Pa·s, or ≤1,800 Pa·s, or ≤1,780 Pa·s.

H] The composition of any one of A]-G] above, wherein the alpha composition has a V1.0 (1.0 rad/s, 100° C.)≥15,200 Pa·s; or ≥15,500 Pa or ≥16,000 Pa·s, or ≥16,200 Pa·s, or ≥17,000 Pa·s, or ≥18,000 Pa·s, or ≥19,000 Pa·s, or ≥20,000 Pa·s, or ≥21,000 Pa·s, or 22,000 Pa·s, or ≥23,000 Pa·s, or ≥24,000 Pa·s, or ≥25,000 Pa·s.

I] The composition of any one of A]-H] above, wherein the alpha composition has a V1.0 (1.0 rad/s; 100° C.)≤250,000 Pa·s; or ≤200,000 Pa·s, or ≤150,000 Pa·s; or ≤120,000 Pa·s, ≤ or 100,000 Pa·s, or ≤80,000 Pa·s, or ≤60,000 Pa·s, ≤ or 55,000 Pa·s, or ≤50,000 Pa·s, or ≤45,000 Pa·s, or ≤40; 000 Pa·s, or ≤38,000 Pa·s.

J] The composition of any one of A]-I] above, wherein the alpha composition has a Rheology Ratio (V1.0/V100, 100° C.)≥8.0, or ≥8.5, or ≥9.0, or ≥9.5, or ≥10.0; or ≥10.5.

K] The composition of any one of A]-J] above, wherein the alpha composition has a Rheology Ratio (V1.0/V100, 100° C.)≤50.0, or ≤40.0, or ≤30.0, or ≤28.0, ≤ or 26.0.

L] The composition of any one of A]-K] above, wherein the alpha composition has a total unsaturation/1000C ≥0.20, or ≥0.25, or ≥0.30, or ≥0.35, or ≥0.40, or ≥0.45, or ≥0.50, or ≥0.52, or ≥0.54, or ≥0.56, or ≥0.58.

M] The composition of any one of A]-L] above, wherein the alpha composition has a total unsaturation/1000C ≤1.00, or ≤0.95, or ≤0.90, or ≤0.85, or ≤0.80, or ≤0.75, or ≤0.70, or ≤0.65, or ≤0.60.

N] The composition of any one of A]-M] above, wherein the alpha composition has a melt index (I2)≥1.0 g/10 min, or ≥1.1 g/10 min, or ≥1.2 g/10 min, or ≥1.3 g/10 min, or % 1.4 g/10 min, or ≥1.6 g/10 min, or ≥1.8 g/10 min, or ≥2.0 g/10 min.

O] The composition of any one of A]-N] above, wherein the alpha composition has a melt index (I2)≤30 g/10 min, or ≤28 g/10 min, or ≤26 g/10 min, or ≤24 g/10 min, or ≤22 g/10 min, or ≤20 g/10 min, or ≤18 g/10 min, or ≤16 g/10 min, or ≤14 g/10 min, or ≤12 g/10 min, or ≤10 g/10 min, or ≤8.0 g/10 min, or ≤6.0 g/10 min, or ≤5.0 g/10 min.

P] The composition of any one of A]-O] above, wherein the alpha composition has an I10/I2 ≥6.0, or ≥6.5, or ≥7.0, or ≥7.5, or ≥8.0, or ≥8.5, or ≥9.0, or ≥9.5, or ≥10.0, or ≥10.5, or ≥11.0, or ≥11.5, or ≥12.0, or ≥12.5, or ≥13.0, or ≥13.5, or ≥14.0, or ≥14.5, or 15.0.

Q] The composition of any one of A]-P] above, wherein the alpha composition has an I10/I2≤40.0, or ≤35.0, or ≤32.0, or ≤30.0, or ≤28.0, or ≤26.0, or ≤24.0.

R] The composition of any one of A]-Q] above, wherein the alpha composition has a number average molecular weight Mn≥16,200 g/mol, or ≥16,400 g/mol, or ≥16,600 g/mol, or ≥16,800 g/mol, or ≥17,000 g/mol, or ≥17,200 g/mol, or ≥17,400 g/mol.

S] The composition of any one of A]-R] above, wherein the alpha composition has a number average molecular weight Mn≤50,000 g/mol, or ≤45,000 g/mol, or ≤40,000 g/mol, or ≤38,000 g/mol, or ≤36,000 g/mol, or ≤34,000 g/mol, or ≤32,000 g/mol, or ≤30,000 g/mol.

T] The composition of any one of A]-S] above, wherein the alpha composition has a weight average molecular weight Mw ≥60,000 g/mol, or ≥65,000 g/mol, or ≥70,000 g/mol, or ≥75,000 g/mol, or ≥80,000 g/mol, or ≥82,000 g/mol, or ≥85,000 g/mol.

U] The composition of any one of A]-T] above, wherein the alpha composition has a weight average molecular weight Mw ≤150,000 g/mol, or ≤145,000 g/mol, or ≤140,000 g/mol, or ≤135,000 g/mol, or ≤130,000 g/mol, or ≤125,000 g/mol, or ≤120,000 g/mol, or ≤115,000 g/mol.

V] The composition of any one of A]-U] above, wherein the alpha composition has a z average molecular weight Mz ≥200,000 g/mol, or ≥205,000 g/mol, or ≥210,000 g/mol, or ≥215,000 g/mol, or ≥220,000 g/mol, or ≥225,000 g/mol, or ≥230,000 g/mol, or ≥235,000 g/mol, or ≥240,000 g/mol, or ≥245,000 g/mol.

W] The composition of any one of A]-V] above, wherein the alpha composition has a z average molecular weight Mz≤600,000 g/mol, or ≤580,000 g/mol, or ≤560,000 g/mol, or 540,000 g/mol, or ≤520,000 g/mol, or ≤500,000 g/mol, or ≤495,000 g/mol, or ≤490,000 g/mol, or ≤485,000 g/mol.

X] The composition of any one of A]-W] above, wherein, the alpha composition has a molecular weight distribution MWD (=Mw/Mn)≥3.00, or ≥3.05, or ≥3.10, or ≥3.20, or 3.30, or ≥3.40, or ≥3.50, or ≥3.60, or ≥3.70, or ≥3.80, or ≥3.90, or ≥4.00, or ≥4.10, or ≥4.20, or ≥4.30, or ≥4.40, or ≥4.50, or ≥4.60, or ≥4.70, or ≥4.80, or ≥4.90, or ≥5.00, or ≥5.10.

Y] The composition of any one of A]-X] above, wherein the alpha composition has a molecular weight distribution MWD ≤8.00, or ≤7.50, or ≤7.00, or ≤6.90, or ≤6.80, or ≤6.70, or ≤6.60, or ≤6.50, or ≤6.40, or ≤6.30.

Z] The composition of any one of A]-Y] above, wherein the alpha composition has a melting temperature (Tm, DSC) ≥30° C., or ≥35° C., or ≥40° C., or ≥45° C., or ≥50° C., or ≥52° C., or ≥54° C., or ≥56° C.

AA] The composition of any one of A]-Z] above, wherein the alpha composition has a melting temperature (Tm, DSC)≤100° C., or ≤95° C., or ≤90° C., or ≤85° C., or ≤80° C., or ≤78° C., or ≤76° C., or ≤74° C., ≤72° C., ≤70° C. or ≤69° C.

BB] The composition of any one of Ai-AA] above, wherein the alpha composition has a glass transition temperature (Tg, DSC)≥−70° C., or ≥−68° C., or ≥−6° C., or ≥−64° C., or −62° C., or ≥−60° C., or ≥−58° C., or ≥−57° C.

CC] The composition of any one of A]-BB] above, wherein the alpha composition has a glass transition temperature (Tg, DSC)≤−40° C., or ≤−45° C., or ≤−50° C., or ≤−51° C., or ≤52° C., or ≤−53° C.

DD] The composition of any one of A]-CC] above, wherein the alpha composition has a crystallization temperature (Tc, DSC)≥30° C., or ≥35° C., ≥38° C., or ≥40° C., or ≥42° C., or ≥44° C., or ≥46° C.

EE] The composition of any one of A]-DD] above, wherein the alpha composition has a crystallization temperature (Tc, DSC)≤90° C., or ≤85° C., or ≤80° C., or ≤75° C., or ≤72° C., or ≤70° C., or ≤68° C., or 66° C., or 64° C.

FF] The composition of any one of A]-EE] above, wherein the alpha composition has a % crystallinity ≥12%, or ≥14%, or ≥16%, or ≥18%, or ≥20%.

GG] The composition of any one of A]-FF] above, wherein the alpha composition has a % crystallinity ≤40%, or ≤35%, or ≤32%, or ≤30%, or ≤28%.

HH] The composition of any one of A]-GG] above, wherein, for the multimodal ethylene/alpha-olefin interpolymer, the $Mn_{(lowest\ 20\%\ mass\ fraction)}$≥2,000 g/mol, or ≥2,500 g/mol, or ≥3,000 g/mol, or ≥3,500 g/mol, or ≥4,000 g/mol, or ≥4,500 g/mol 5,000 g/mol, or 5,200 g/mol, or ≥5,400 g/mol, or ≥5,500 g/mol.

II] The composition of any one of A]-HH] above, wherein for the multimodal ethylene/alpha-olefin interpolymer, the $Mn_{(lowest\ 20\%\ mass\ fraction)}$≤35,000 g/mol, or ≤30,000 g/mol, or ≤25,000 g/mol, or ≤20,000 g/mol, or ≤18,000 g/mol, or ≤16,000 g/mol, or ≤14,000 g/mol, or ≤12,000 g/mol, or ≤10,000 g/mol.

JJ] The composition of any one of A]-II] above, wherein for the multimodal ethylene/-alpha-olefin interpolymer, the $Mn_{(highest\ 20\%\ mass\ fraction)}$≥160,000 g/mol, or ≥170.000 g/mol, or ≥175,000 g/mol, or ≥180,000 g/mol, or ≥185,000 g/mol, or ≥190,000 g/mol.

KK] The composition of any one of A]-JJ] above, wherein for the multimodal ethylene/alpha-olefin interpolyrner, the $Mn_{(highest\ 20\%\ mass\ fraction)}$≤400,000 g/mol, or 380,000 g/mol, or ≤360,000 g/mol, or ≤340,000 g/mol, or ≤320,000 g/mol.

LL] The composition of any one of A]-KK] above, wherein, for the multimodal ethylene/alpha-olefin interpolymer, the ratio $[Mn_{(highest\ 20\%\ mass\ fraction)}/Mn_{(lowest\ 20\%\ mass\ fraction)}]$ ≥16.0, or ≥16.5, or ≥ or 17.0, or ≥17.5, or ≥18.0, or ≥ or 18.5, or ≥19.0, or ≥19.5, or ≥20.0.

MM] The composition of any one of A]-LL] above, wherein for the multimodal ethylene/alpha-olefin interpolymer, the ratio $[Mn_{(highest\ 20\%\ mass\ fraction)}/Mn_{(lowest\ 20\%\ mass\ fraction)}]$ ≤100.0, or ≤90.0, or ≤80.0, or ≤75.0, or ≤70.0, or ≤65.0, or ≤60.0, or ≤55.0.

NN] The composition of any one of A]-MM] above, wherein the multimodal ethylene/alpha-olefin interpolymer comprises a first ethylene/alpha-olefin interpolymer fraction and a second ethylene/alpha-olefin interpolymer fraction.

OO] The composition of NN] above, wherein the first ethylene/alpha-olefin interpolymer fraction differs from the second ethylene/alpha-olefin interpolymer fraction in one or more properties selected from comonomer content, I2, I10/I2, Mn, Mw. Mz, MWD, or any combination thereof, and further, in one or more properties selected from Mn, Mw. Mz, MWD, or any combination thereof.

PP] The composition of any one of NN] or OO] above, wherein the multimodal ethylene/alpha-olefin interpolymer comprises ≥98.0 wt %, or ≥98.5 wt %, or ≥99.0 wt %, or ≥99.5 wt %, or ≥99.8 wt %, or ≥99.9 wt % of the sum of the first ethylene/alpha-olefin interpolymer fraction and the second ethylene/alpha-olefin interpolymer fraction, based on the weight of the multimodal ethylene/alpha-olefin interpolymer.

QQ] The composition of any one of NN]-PP] above, wherein the multimodal ethylene/alpha-olefin interpolymer comprises ≤100.0 wt % of sum of the first ethylene/alpha-olefin interpolymer fraction and the second ethylene/alpha-olefin interpolymer fraction, based on the weight of the multimodal ethylene/alpha-olefin interpolymer.

RR] The composition of any one of NN]-QQ] above, wherein, for the first ethylene/alpha-1.5 olefin interpolymer fraction, the alpha-olefin is a C3-C20 alpha-olefin, and further a C3-C10 alpha-olefin.

SS] The composition of any one of NN]-RR] above, wherein, for the first ethylene/alpha-olefin interpolymer fraction, the alpha-olefin is selected from propylene, 1-butene, 1-pentene, 1-hexene or 1-octene, and further propylene, 1-butene or 1-octene, and further 1-butene or 1-octene, and further 1-octene.

TT] The composition of any one of NN]-SS] above, wherein the first ethylene/alpha-olefin interpolymer fraction is a first ethylene/alpha-olefin copolymer.

UU] The composition of any one of NN]-TT] above, wherein the first ethylene/alpha-olefin interpolymer fraction is selected from the following: an ethylene/propylene copolymer, an ethylene/butene copolymer, or an ethylene/octene copolymer, and further an ethylene/butene copolymer, or an ethylene/octene copolymer, and further an ethylene/octene copolymer.

VV] The composition of any one of NN]-UU] above, wherein, for the second ethylene/-alpha-olefin interpolymer fraction, the alpha-olefin is a C3-C20 alpha-olefin, and further a C3-C10 alpha-olefin.

WW] The composition of any one of NN]-VV] above, wherein, for the second ethylene/alpha-olefin interpolymer fraction, the alpha-olefin is selected from propylene, 1-butene, 1-pentene, 1-hexene or 1-octene, and further propylene, 1-butene or 1-octene, and further 1-butene or 1-octene, and further 1-octene.

XX] The composition of any one of NN]-WW] above, wherein the second ethylene/alpha-olefin interpolymer fraction is a second ethylene/alpha-olefin copolymer.

YY] The composition of any one of NN]-XX] above, wherein the second ethylene/alpha-olefin interpolymer fraction is selected from the following: an ethylene/propylene copolymer, an ethylene/butene copolymer, or an ethylene/octene copolymer, and further an ethylene/butene copolymer, or an ethylene/octene copolymer, and further an ethylene/octene copolymer.

ZZ] The composition of any one of A]-YY] above, wherein the multimodal ethylene/alpha-olefin interpolymer comprises 50 wt % or a majority weight percent of polymerized ethylene, based on the weight of the multimodal ethylene/alpha-olefin interpolymer.

A3] The composition of any one of A]-ZZ] above, wherein the composition comprises ≥50.0 wt %, or ≥55.0 wt %, or ≥60.0 wt %, or ≥65.0 wt %, or ≥70.0 wt %, or ≥75.0 wt %, or 80.0 wt %, or ≥85.0 wt %, or ≥90.0 wt % of the alpha composition, based on the weight of the composition.

B3] The composition of any one of A]-A3] above, wherein the composition comprises ≥95.0 wt %, or ≥95.5 wt %, or ≥96.0 wt %, or ≥96.5 wt %, or ≥97.0 wt %, or ≥97.5 wt %, or ≥98.0 wt %, or ≥98.1 wt % of the alpha composition, based on the weight of the composition.

C3] The composition of any one of A]-B3] above, wherein the composition comprises ≤99.8 wt %, ≤99.6 wt %, or ≤99.4 wt %, or ≤99.2 wt %, or ≤99.0 wt %, or ≤98.8 wt %, or 98.6 wt %, or ≤98.4 wt %, or ≤98.3 wt % of the alpha composition, based on the weight of the composition.

D3] The composition of any one of A]-C3] above, wherein the alpha composition further comprises a unimodal ethylene/alpha-olefin interpolymer that has a MWD from 1.80 to 2.50, or from 1.85 to 2.45, or from 1.90 to 2.40.

E3] The composition of D3] above, wherein the unimodal ethylene/alpha-olefin interpolymer has a density from 0.860 to 0.890 g/cc, or from 0.865 to 0.888 g/cc, or from 0.865 to 0.885 g/cc.

F3] The composition of D3] or E3] above, wherein the unimodal ethylene/alpha-olefin interpolymer has a melt index (I2) from 0.2 to 10 g/10 min, or from 0.3 to 5.0 g/10 min, or from 0.4 to 2.0 g/10 min.

G3] The composition of any one of D3]-F3] above, wherein, for the unimodal ethylene-/alpha-olefin interpolymer, the alpha-olefin is a C3-C20 alpha-olefin, and furthera C3-C10 alpha-olefin.

H3] The composition of any one of D3]-G3] above, wherein, for the unimodal ethylene/alpha-olefin interpolymer, the alpha-olefin is selected from propylene, 1-butene, 1-pentene, 1-hexene or 1-octene, and further propylene, 1-butene or 1-octene, and further 1-butene or 1-octene, and further 1-octene.

I3] The composition of any one of D3]-H3] above, wherein the unimodal ethylene/alpha-olefin interpolymer is an ethylene/alpha-olefin copolymer.

J3] The composition of any one of D3]-I3] above, wherein the unimodal ethylene/alpha-olefin interpolymer is selected from the following: an ethylene/propylene copolymer, an ethylene/butene copolymer, or an ethylene/octene copolymer, and further an ethylene/butene copolymer, or an ethylene/octene copolymer, and further an ethylene/octene copolymer.

K3] The composition of any one of D3]-J3] above, wherein the alpha composition comprises ≥10.0 wt %, or ≥12.0 wt %, or ≥14.0 wt %, or ≥16.0 wt %, or ≥17.0 wt %, or 18.0 wt % of the unimodal ethylene/alpha-olefin interpolymer; based on the weight of the alpha composition.

L3] The composition of any one of D3]-K3] above, wherein the alpha composition comprises ≤40.0 wt %, or ≤35.0 wt %, or ≤30.0 wt %, or ≤28.0 wt %, or ≤26.0 wt %, or 24.0 wt %, or ≤22.0 wt %, or ≤20.0 wt % of the unimodal ethylene/alpha-olefin interpolymer, based on the weight of the alpha composition.

M3] The composition of any one of D3]-L3] above, wherein the weight ratio of the multimodal ethylene/alpha-olefin interpolymer to the unimodal ethylene/alpha-olefin interpolymer is ≥2.0, or ≥2.5, or ≥3.0, or ≥3.5, or ≥4.0.

N3] The composition of any one of D3]-M3] above, wherein the weight ratio of the multimodal ethylene/alpha-olefin interpolymer to the unimodal ethylene/alpha-olefin interpolymer is ≤7.0, or ≤6.5, or ≤6.0, or ≤5.5, or ≤5.0, or ≤4.5.

O3] The composition of any one of A]-N3] above, wherein the weight ratio of the peroxide to the silane coupling agent is ≥0.5, or ≥1.0, or ≥1.5, or ≥2.0, or ≥2.5, or ≥3.0, or ≥3.5, or ≥4.0.

P3] The composition of any one of A]-O3] above, wherein the weight ratio of the peroxide to the silane coupling agent is ≤7.0, or ≤6.5, or ≤6.0, or ≤5.5, or ≤5.0, or ≤4.5.

Q3] The composition of any one of A]-P3] (A through P3) above, wherein the composition further comprises a crosslinking coagent.

R3] The composition of Q3] above, wherein the crosslinking coagent is present in an amount ≥0.05 wt %, or ≥0.10 wt %, or ≥0.15 wt %, or ≥0.20 wt %, or ≥0.25 wt %, or ≥0.30 wt %, or ≥0.35 wt %, or ≥0.40 wt %, or ≥0.45 wt %, or ≥0.50 wt %, based on the weight of the composition.

S3] The composition of Q3] or R3] above, wherein the crosslinking coagent is present in an amount ≤3.00 wt %, or ≤2.50 wt %, or ≤2.00 wt %, or ≤1.50 wt %, or ≤1.00 wt %, or ≤0.80 wt %, based on the weight of the composition.

T3] The composition of any one of Q3]-S3] above, wherein the weight ratio of the peroxide to the coagent is ≥0.5, or ≥0.8, or ≥1.0, or ≥1.1, or ≥1.2, or ≥1.3, or ≥1.4, or ≥1.5, or ≥1.6, or ≥1.8.

U3] The composition of any one of Q3]-T3] above, wherein the weight ratio of the peroxide to the coagent is ≤3.0, or ≤2.8, or ≤2.6, or ≤2.4, or ≤2.3, or ≤2.2, or ≤2.0.

V3] The composition of any one of Q3]-U3] above, wherein the weight ratio of the coagent to the silane coupling agent is ≥1.0, or ≥1.2, or %1.4, or ≥1.6, or ≥1.8, or ≥2.0.

W3] The composition of any one of Q3]-V3] above, wherein the wherein the weight ratio of the coagent to the slime coupling agent is ≤3.6, or ≤3.4, or ≤3.2, or ≤3.0, or ≤2.8, or ≤2.6, or ≤2.4.

X3] The composition of any one of A]-W3] above, wherein the wherein the composition comprises ≥0.05 wt %, or ≥0.10 wt %, or ≥0.15 wt %, or ≥0.20 wt %, or ≥0.25 wt %, or 0.30 wt %, or ≥0.35 wt %, or ≥0.40 wt %, or ≥0.45 wt %, or ≥0.50 wt % of the peroxide, based on the weight of the composition.

Y3] The composition of any one of A]-X3] above, wherein the wherein the composition comprises ≤5.00 wt %, or ≤4.50 wt %, or ≤4.00 wt %, or ≤3.50 wt %, or ≤3.00 wt %, or 2.50 wt %, or ≤2.00 wt %, or ≤1.50 wt %, or ≤1.00 wt % of the peroxide, based on the weight of the composition.

Z3] The composition of any one of A]-Y3] above, wherein the wherein the composition comprises ≥0.05 wt %, or ≥0.10 wt %, or ≥0.15 wt %, or ≥0.20 wt %, of the silane coupling agent, based on the weight of the composition.

A4] The composition of any one of A]-Z3] above, wherein the wherein the composition comprises ≤3.00 wt %, or ≤2.50 wt %, or ≤2.00 wt %, or ≤1.50 wt %, or ≤1.00 wt %, or 0.50 wt %, or ≤0.40 wt % of the silane coupling agent, based on the weight of the composition.

B4] The composition of any one of ]-A4] above, wherein the composition comprises 99.0 wt %, or ≥99.1 wt %, or ≥99.2 wt %, or ≥99.3 wt %, or ≥99.4 wt % of the sum of components a)-c), based on the weight of the composition.

C4] The composition of any one of A]-B4] above, wherein the composition comprises ≤100.0 wt %, or ≤99.9 wt %, ≤99.8 wt %, or 99.7 wt %, or ≤99.6 wt %, or ≤99.5 wt % of the sum of components a)-c), based on the weight of the composition.

D4] The composition of any one of A]-C4] above, wherein the composition further comprises at least one additive selected from UV stabilizers, antioxidants or combinations thereof.

E4] The composition of D4] above, wherein the at least one additive is present in an amount ≥0.01 wt %, or ≥0.02 wt %, or 0.03 wt %, or ≥0.04 wt %, or ≥0.05 wt %, or 0.06 wt %, or ≥0.07 wt %, or ≥0.08 wt %, or ≥0.09 wt %, or ≥0.10 wt %, based on the weight of the composition.

F4] The composition of D4] or E4] above, wherein the at least one additive is present in an amount ≤2.00 wt %, or ≤1.50 wt %, or ≤1.00 wt %, or 0.90 wt %, or ≤0.80 wt %, or ≤0.70 wt %, or 0.60 wt %, or 0.50 wt %, or ≤0.40 wt %, 0.30 wt %, or ≤0.20 wt %, based on the weight of the composition.

G4] The composition of any one of A]-F4] above, wherein the alpha composition comprises ≥70.0 wt %, or ≥75.0 wt %, or ≥80.0 wt %, or ≥85.0 wt %, or ≥90.0 wt %, or 95.0 wt %, or ≥98.0 wt %, or ≥98.5 wt %, or ≥99.0 wt %, or ≥99.5 wt %, or ≥99.8 wt %, or ≥99.9 wt % of the multimodal ethylene/alpha-olefin interpolymer, based on the weight of the alpha composition.

H4] The composition of any one of A]-G4] above, wherein the alpha composition comprises ≤100.0 wt % of the multimodal ethylene/alpha-olefin interpolymer, based on the weight of the alpha composition.

I4] The composition of any one of A]-H4] above, wherein the multimodal ethylene/alpha-olefin interpolymer is formed in the presence of two catalysts in one reactor.

J4] A crosslinked composition formed from the composition of any one of A]-I4] above.

K4] The composition of any one of J4] above, wherein the composition has a "MH-ML" value ≥2.50, or ≥2.55, or ≥2.60, or ≥2.65≥2.70, or ≥2.75, or ≥2.80, or ≥2.85.

L4] The composition of J4] or K4] above, wherein the composition has a "Gel %" value ≥88%, or ≥89%, or ≥90%, or ≥91%.

M4] An article comprising at least one component formed from the composition of any one of A]-L4] above.

N4] The article of M4], wherein the article is a film, and further an extruded film and/or a cast film.

O4] The article of M4], wherein the article is a solar cell module.

P4] A process of forming a solar cell module, said process comprising laminating an array of solar cells between two film layers, and wherein each film layer is, independently, formed from the composition of any one of A]-L4] above.

Q4] The process of P4] above, wherein each film layer is formed from the same composition.

Test Methods

MDR Test

Cure characteristics were measured using an Alpha Technologies Moving Die Rheometer (MDR) 2000 E, according to ASTMD5289, with a 0.5 deg arc. For each composition, the MDR was loaded with approximately 4 g of pellets. The MDR was run for 30 minutes, at 150° C., and the "time vs torque" profile was generated over the given interval. The following data were used from each MDR run: MH (dNm), or the maximum torque exerted by the MDR during the 30 minute testing interval (this usually corresponds to the torque exerted at 30-minute time point); and ML (dNm), or the minimum torque exerted by the MDR during the 30 minute testing interval (this usually corresponds to the torque exerted at the beginning of the test interval).

Dynamic Mechanical Spectroscopy (DMS)

The rheology of each composition was analyzed by DMS, using an Advanced Rheometric Expansion System (ARES), equipped with "25 mm stainless steel parallel plates," under a nitrogen purge. A constant temperature dynamic frequency sweep, in the range of 0.1 to 100 rad/s, was performed under nitrogen, at 100° C. (see Table 2). The data were used to evaluate the composition processability in a PV encapsulant film fabrication. A sample of approximately "25 mm diameter×3.3 mm thick" was cut from a compression molded disc (see below). The sample was placed on the lower plate and allowed to melt for five minutes. The plates were then closed to a gap of "2.0 mm," and the sample trimmed to "25 mm" in diameter. The sample was allowed to equilibrate at 100° C. for five minutes, before starting the test. The complex viscosity was measured at a constant strain amplitude of 10%. The stress response was analyzed in terms of amplitude and phase, from which the storage modulus (G'), loss modulus (G"), dynamic viscosity η*, and tan delta could be calculated. Each compression molded disc was formed at 180° C., and 10 MPa molding pressure, for five minutes, ambient atmosphere, and then quenched between chilled platens (15-20° C.) for two minutes. The Viscosities (V1.0, V100) were recorded.

Gel Permeation Chromatography

The chromatographic system consisted of a PolymerChar GPC-IR (Valencia, Spain) high temperature GPC chromatograph, equipped with an internal IR5 infra-red detector (IR5 The autosampler oven compartment was set at 160° Celsius, and the column compartment was set at 150° Celsius. The columns were four AGILENT "Mixed A" 30 cm 20-micron linear mixed-bed columns. The chromatographic solvent was 1,2,4-trichloro-benzene, which contained 200 ppm of butylated hydroxytoluene (BHT). The solvent source was nitrogen sparged. The injection volume used was 200 microliters, and the flow rate was 1.0 milliliters/minute.

Calibration of the GPC column set was performed with 21 narrow molecular weight distribution polystyrene standards, with molecular weights ranging from 580 to 8,400,000, and which were arranged in six "cocktail" mixtures, with at least a decade of separation between individual molecular weights. The standards were purchased from Agilent Technologies. The polystyrene standards were prepared at "0.025 grams in 50 milliliters" of solvent, for molecular weights equal to or greater than 1,000,000, and at "0.05 grams in 50 milliliters" of solvent, for molecular weights less than 1,000,000. The polystyrene standards were dissolved at 80 degrees Celsius, with gentle agitation, for 30 minutes. The polystyrene standard peak molecular weights were converted to polyethylene molecular weights using Equation 1 (as described in Williams and Ward, J. Polym. Sci., Polym. Let., 6, 621 (1968)):

$M_{polyethyiene} = A \times (M_{polystyrene})^B$ (EQ1), where M is the molecular weight, A has a value of 0.4315 and B is equal to 1.0.

A fifth order polynomial was used to fit the respective polyethylene-equivalent calibration points. A small adjustment to A (from approximately 0.375 to 0.445) was made to correct for column resolution and band-broadening effects, such that linear homopolymer polyethylene standard is obtained at 120,000 Mw.

The total plate count of the GPC column set was performed with decane (prepared at 0.04 g in 50 milliliters of TCB, and dissolved for 20 minutes with gentle agitation.) The plate count (Equation 2) and symmetry (Equation 3) were measured on a 200 microliter injection according to the following equations:

$$\text{Plate Count} = 5.54 * \left( \frac{(RV_{Peak\,Max})}{\text{Peak Width at } \frac{1}{2} \text{ height}} \right)^2, \quad \text{(EQ 2)}$$

where RV is the retention volume in milliliters, the peak width is in milliliters, the peak max is the maximum height of the peak, and ½ height is ½ height of the peak maximum; and $$\text{Symmetry} = \frac{(\text{Rear Peak } RV_{one\,tenth\,height} - RV_{Peak\,max})}{(RV_{Peak\,max} - \text{Front Peak } RV_{one\,tenth\,height})}, \quad \text{(EQ 3)}$$

where RV is the retention volume in milliliters, and the peak width is in milliliters, Peak max is the maximum position of the peak, one tenth height is 1/10 height of the peak maximum, and where rear peak refers to the peak tail at later retention volumes than the peak max, and where front peak refers to the peak front at earlier retention volumes than the peak max. The plate count for the chromatographic system should be greater than 18,000, and symmetry should be between 0.98 and 1.22.

Samples were prepared in a semi-automatic manner with the PolymerChar "Instrument Control" Software, wherein the samples were weight-targeted at 2 mg/ml, and the solvent (contained 200 ppm BHT) was added to a pre nitrogen-sparged, septa-capped vial, via the PolymerChar high temperature autosampler. The samples were dissolved for two hours at 160° Celsius under "low speed" shaking.

The calculations of $Mn_{(GPC)}$, $Mw_{(GPC)}$, and $Mz_{(GPC)}$ were based on GPC results using the internal IR5 detector (measurement channel) of the PolymerChar GPC-IR chromatograph according to Equations 4-6, using PolymerChar GPCOne™ software, the baseline-subtracted IR chromatogram at each equally-spaced data collection point (i), and the polyethylene equivalent molecular weight obtained from the narrow standard calibration curve for the point (i) from Equation 1. Equations 4-6 are as follows:

$$M_{n(GPC)} = \frac{\sum_i IR_i}{\sum_i (IR_i/M_{polyethylene_i})}, \quad (EQ\ 4)$$

$$M_{w(GPC)} = \frac{\sum_i (IR_i/M_{polyethylene_i})}{\sum_i IR_i}, \quad (EQ\ 5)$$

and $$M_{z(GPC)} = \frac{\sum_i (IR_i * M_{polyethylene_i}^2)}{\sum_i (IR_i * M_{polyethylene_i})}. \quad (EQ\ 6)$$

In order to monitor the deviations over time, a flowrate marker (decane) was introduced into each sample, via a micropump controlled with the PolymerChar GPC-IR system. This flowrate marker (FM) was used to linearly correct the pump flowrate (Flowrate(nominal)) for each sample, by RV alignment of the respective decane peak within the sample (RV(FM Sample)), to that of the decane peak within the narrow standards calibration (RV(FM Calibrated)). Any changes in the time of the decane marker peak were then assumed to be related to a linear-shift in flowrate (Flowrate (effective)) for the entire run. To facilitate the highest accuracy of a RV measurement of the flow marker peak, a least-squares fitting routine was used to fit the peak of the flow marker concentration chromatogram to a quadratic equation. The first derivative of the quadratic equation was then used to solve for the true peak position. After calibrating the system, based on a flow marker peak, the effective flowrate (with respect to the narrow standards calibration) was calculated as Equation 7: Flowrate(effective)=Flowrate (nominal)*(RV(FM Calibrated)/RV(FM Sample)) (EQ7).

Processing of the flow marker peak was done via the PolymerChar GPCOne™ Software. Acceptable flowrate correction is such that the effective flowrate should be within +/−0.7% of the nominal flowrate.

Differential Scanning Calorimetry (DSC)

Differential Scanning calorimetry (DSC) is used to measure Tm, Tc, Tg and crystallinity in ethylene-based (PE) samples and propylene-based (PP) samples. Each sample (0.5 g) was compression molded into a film, at 5000 psi, 190° C., for two minutes. About 5 to 8 mg of film sample was weighed and placed in a DSC pan. The lid was crimped on the pan to ensure a closed atmosphere. The sample pan was placed in a DSC cell, and then heated, at a rate of approximately 10° C./rain, to a temperature of 180° C. for PE (230° C. for PP). The sample was kept at this temperature for three minutes. Then the sample was cooled at a rate of 10° C./min to −90° C. for PE (−60° C. for PP), and kept isothermally at that temperature for three minutes. The sample was next heated at a rate of 10° C./min, until complete melting (second heat). Unless otherwise stated, melting point (Tm) and the glass transition temperature (Tg) of each polymer were determined from the second heat curve, and the crystallization temperature (Tc) was determined from the first cooling curve. The respective peak temperatures for the Tm and the Tc were recorded. The percent crystallinity can be calculated by dividing the heat of fusion (Hf), determined from the second heat curve, by a theoretical heat of fusion of 292 J/g for PE (165 J/g for PP), and multiplying this quantity by 100 (for example, % cryst.=(Hf/292 J/g)×100 (for PE)).

1H NMR Method

Sample Preparation. The samples were prepared by adding approx. 130 mg of sample to 3.25 g of 50/50 by weight Tetrachlorethane-d2/Perchloroethylene, with 0.001 M Cr(A-cAc)$_3$, in a NORELL 1001-7, 10 mm, NMR tube. The samples were purged by bubbling N$_2$ through the solvent, via a pipette inserted into the tube, for approximately five minutes to prevent oxidation. The tube was next capped, sealed with TEFLON tape, and then soaked at room temperature, overnight, to facilitate sample dissolution. The samples were kept in a N$_2$ purge box during storage, before, and after preparation, to minimize exposure to O$_2$. The samples were heated, and vortexed at 115° C., to ensure homogeneity.

Data Acquisition Parameters and Data Analysis. $^1$H NMR was performed on a Bruker AVANCE 600 MHz spectrometer, equipped with a Bruker high-temperature CryoProbe, and at a sample temperature of 120° C. Two experiments were run to obtain spectra, a control spectrum to quantitate the total polymer protons, and a double presaturation experiment, which suppresses the intense peaks associated to the polymer chains, and enables high sensitivity spectra for quantitation of the end-groups. The control was run with ZG pulse, 4 scans, SWH 10,000 Hz, AQ 1.82s, D$_1$ 14 s. The double pre-saturation experiment was run with a modified pulse sequence, Ic1prf2.zz, TD 32768, 64 scans, DS 2, SWH 9,000 Hz, AQ 1.82s, D$_1$ 2 s, D$_{13}$ 12 s. Unsaturation measurements were made according to the method described as below. Area under the resonance from the polymer chains (i.e., CH, CH$_2$, and CH$_3$ in the polymers) was measured from the spectrum acquired during first experiment (the control spectrum), described above. Area under the four key types of unsaturation (i.e., vinyl, vinylene, trisubstituted, and vinylidene) was measured from spectrum acquired during the second (presaturation) experiment described above. Both spectra were normalized to the area under resonance from the solvent. Moles of respective unsaturation were calculated by dividing the area under the unsaturation resonance by the number of protons contributing to that resonance. Moles of carbons in the polymers were calculated by dividing the area under the peaks for polymer chains (i.e., CH$_2$, and CH$_3$ in the polymers) by two. The amount of total unsaturation was then expressed as a relative ratio of moles of total unsaturation to the moles of carbons in the polymers, with expression of the number of unsaturation per 1000 Carbon.

Gel Content

Gel content was determined in accordance with ASTM D2765-01, Method A, in xylene. The cured sample, cut from a compression-molded plaque, was cut to required size using a razorblade. Each compression molded plaque was formed at 150° C., and 30,000 psi molding pressure, for thirty minutes, ambient atmosphere, and then quenched between chilled platens (15-20° C.) for ten minutes.

Melt Index

The melt index I2 (or MI) of an ethylene-based polymer is measured in accordance with ASTM D-1238, condition 190'C/2.16 kg (melt index I5 at 190'C/5.0 kg, melt index I10 at 190° C./10.0 kg, high load melt index I21 at 190° C./21.0 kg). The melt flow rate MFR of a propylene-based polymer is measured in accordance with ASTM D-1238, condition 230° C./2.16 kg.

Polymer Density

Polymer density is measured in accordance with ASTM D-792.

EXPERIMENTAL

Polymers and Additives

Ethylene/1-octene random copolymer: density 0.880 g/cc, I2 18 g/10 min(see, for example, XUS 38661 Polyolefin Elastomer from The Dow Chemical Company). This copolymer is noted as "POE661" in the tables below.

ENGAGE 8407 Polyolefin Elastomer from The Dow Chemical Company, ethylene/1-octene random copolymer: density 0.870 g/cc, I2 30 g/10 min, Tm 65° C., Tg −54° C. Noted as POE 407 in the tables below.

ENGAGE 8200 Polyolefin Elastomer from The Dow Chemical Company, ethylene/1-octene random copolymer: density 0.870 g/cc, I2 5.0 g/10 min, Tm 59° C., Tg −53° C. Noted as POE 200 in the tables below.

ENGAGE 8150 Polyolefin Elastomer from The Dow Chemical Company, ethylene/1-octene random copolymer: density 0.868 g/cc, I2 0.5 g/10 min, Tm 55° C., Tg −52° C. Noted as POE 150 in the tables below.

TBEC: tert-butylperoxy-2-ethylhexyl carbonate. LUPEROX TBEC organic peroxide from Arkema.

VMMS: 3-(trimethoxysilyl) propyl-methacrylate. Silane coupling agent from Dow Corning.

Crosslinking coagent: triallyl isocyanurate.

CAT A: 6',6'''-(((diisopropylsilanediyl)bis(methylene))bis(oxy))bis(3-(3,6-di-tert-butyl-9H-carbazol-9-yl)-3'-fluoro-5-(2,4,4-trimethylpentan-2-yl)-[1,1'-biphenyl]-2-ol)dimethyl-hafnium (WO2018022975).

CAT B: 6',6'''-(propane-1,3-diylbis(oxy))bis(3-(3,6-di-tert-butyl-9H-carbazol-9-yl)-3'-fluoro-5-(2,4,4-trimethylpentan-2-yl)-[1,1'-biphenyl]-2-ol)dimethyl-zirconium (WO2012027448).

CAT C: 6',6'''-((2-(tert-butyl)propane-1,3-diyl)bis(oxy))bis(3-(3,6-di-tert-butyl-9H-carbazol-9-yl)-3¹-fluoro-5-(2,4,4-trimethylpentan-2-yl)-[1,1'-biphenyl]-2-ol)dimethyl-zirconium (WO2016014749).

Co-CAT 1: A mixture of methyldi($C_{14\text{-}18}$alkyl)ammonium salts of tetrakis-(pentafluorophenyl)borate, prepared by reaction of a long chain trialkylamine (ARMEEN M2HT, available from Akzo-Nobel, Inc.), HCl and Li[B($C_6F_5$)$_4$], substantially as disclosed in U.S. Pat. No. 5,919,983, Ex, 2 (no further purification performed), from Boulder Scientific.

Co-CAT 2: Modified methylalumoxane (MMAO) Type 3A (no further purification performed), from Akzo Nobel.

Polymer Syntheses and Properties

Each multimodal ethylene/alpha-olefin interpolymer was prepared in a one gallon polymerization reactor, which was hydraulically full and operated at steady state conditions. The catalysts and cocatalysts are listed above. The solvent, hydrogen, catalysts, and cocatalysts were fed to the reactor according to the process conditions outlined in Tables 1A, 1B, and 1C, to produce the multimodal interpolymers. The solvent used was ISOPARE supplied by the ExxonMobil Chemical Company.

Overall properties are shown in Tables 2 and 3, and molecular weight properties of the multimodal interpolymers are shown in Table 4. Properties of the commercial, comparative polymers are shown in Table 5. Note that in Table 2, the DMS Rheology data (100° C.) for each alpha composition is representative of the DMS data for the uncured polymer composition, as shown in Table 6 (each composition contains 98.25 wt % of the alpha composition, which makes-up the bulk of the composition, and thus dominates the overall composition rheology).

TABLE 1A

Reactor Conditions

| Multi-modal Inter-polymer | Reactor Temp., C. | Reactor Pressure, psig | Solvent, lb/hr | Ethylene, lb/hr | Octene, lb/hr | Hydrogen, sccm | Ethylene conversion, % |
|---|---|---|---|---|---|---|---|
| POE A | 197 | 725 | 41.84 | 3.67 | 7.79 | 3.2 | 76.2 |
| POE B | 165 | 650 | 29.02 | 4.15 | 6.23 | 60.0 | 82.7 |
| POE C | 165 | 650 | 29.01 | 4.15 | 4.50 | 52.0 | 81.7 |
| POE D | 165 | 650 | 29.01 | 4.15 | 6.23 | 60.0 | 82.1 |

TABLE 1B

Catalyst Feed Flows

| Multimodal Inter-polymer | Catalyst 1 | Catalyst 1 Solution Flow, lb/hr | Catalyst 1 Solution Metal Conc., ppm* | Catalyst 2 | Catalyst 2 Solution Flow, lb/hr | Catalyst 2 Solution Metal Conc., ppm* |
|---|---|---|---|---|---|---|
| POE A | CAT B | 0.47 | 2.15 | CAT A | 0.70 | 0.98 |
| POE B | CAT A | 0.35 | 1.39 | CAT C | 0.18 | 5.59 |
| POE C | CAT A | 0.39 | 1.39 | CAT C | 0.25 | 3.40 |
| POE D | CAT A | 0.38 | 1.39 | CAT C | 0.17 | 5.59 |

*The "ppm" amount based on the weight of the respective catalyst feed solution.

TABLE 1C

Cocatalyst Feed Flows

| Multimodal Interpolymer | Co-CAT 1 Solution Flow, lb/hr | Co-CAT 1 Solution Conc., ppm* | Co-CAT 2 Solution Flow, lb/hr | Co-CAT 2 Solution Conc., (ppm Al)** |
|---|---|---|---|---|
| POE A | 0.69 | 30.8 | 0.29 | 34.7 |
| POE B | 0.32 | 61.5 | 0.18 | 42.0 |
| POE C | 0.29 | 61.5 | 0.16 | 42.0 |
| POE D | 0.31 | 61.5 | 0.17 | 42.0 |

*The "ppm" amount based on the weight of the co-catalyst feed solution.
**The "ppm" amount of Al based on the weight of the co-catalyst feed solution.

TABLE 2

Overall Properties

| | Alpha Composition | | | Conventional GPC Summary | | | | | DMS at 100° C. | |
|---|---|---|---|---|---|---|---|---|---|---|
| | Density (g/cc) | MI (dg/min) | I10/I2 | Mn kg/(mol) | Mw (kg/mol) | Mz (kg/mol) | Mz/Mn | Mw/Mn | V1.0 (Pa·s) | V100 (Pa·s) |
| POE A | 0.87 | 4.3 | 11.5 | 28 | 86 | 247 | 8.8 | 3.07 | 16,448 | 1,767 |
| POE B | 0.867 | 2.7 | 23.3 | 18 | 112 | 483 | 26.8 | 6.22 | 15,755 | 908 |
| POE C | 0.881 | 1.4 | 21.5 | 18 | 93 | 317 | 17.6 | 5.17 | 36,024 | 1,643 |
| POE D | 0.867 | 7.5 | 19 | 14 | 86 | 332 | 23.7 | 6.14 | 14,414 | 898 |
| Blend A[A] | 0.867[B] | — | — | >16* | — | — | >8.0** | — | 24,985 | 1,490 |

*Estimated Mn **Estimated Mz/Mn [A]Blend A = POE B (80 wt %) and POE 150 (20 wt %). [B]Density of the Blend A was estimated from the weight fraction and density of each individual component using the following equation: Density(Blend) = {100% / [(80%/0.867 g/cc) + (20%/0.868 g/cc)]} = 0.867g/cc.

TABLE 3

Overall Properties

| | $^1$H NMR Unsaturation Total Unsaturation/ | DSC | | | | |
|---|---|---|---|---|---|---|
| Alpha Composition | 1000C from $^1$H NMR | Tg (° C.) | Tm1 (° C.) | Hf (J/g) | Tc1 (°C) | % Cryst.* |
| POE A | 0.59 | −56.0 | 60.0 | 61.2 | 62.8 | 21% |
| POE B | 0.58 | −56.2 | 57.3 | 75.6 | 46.3 | 26% |
| POE C | — | −53.0 | 68.4 | 76.0 | 63.2 | 26% |
| POE D | — | −57.4 | 55.6 | 61.9 | 35.0 | 21% |

*% Cryst. = (Hf/292 J/g) × 100.

TABLE 4

Mn ($f_L$) at lowest 20% mass fraction and Mn ($f_H$) at highest 20% mass fraction

| Multimodal Interpolymer for Alpha Composition | $M_n$ ($f_L$) (kg/mol) | $M_n$ ($f_H$) (kg/mol) | $M_n$ ($f_H$)/ $M_n$ ($f_L$) |
|---|---|---|---|
| POE A | 9.6 | 198.4 | 20.6 |
| POE B | 5.9 | 312.4 | 53.3 |
| POE C | 5.6 | 256.2 | 46.1 |
| POE D | 4.4 | 238.7 | 54.8 |
| Commercial Polymers (unimodal) | — | — | — |
| POE 407 | 8.2 | 98.5 | 12.0 |
| POE 200 | 7.5 | 101.5 | 13.4 |
| POE 661 | 11.8 | 163.6 | 13.9 |

TABLE 5

Commercial Polymers

| | | | | Conventional GPC Summary | | | | | DMS at 100° C. | |
|---|---|---|---|---|---|---|---|---|---|---|
| | Density (g/cc) | MI (dg/min) | I10/I2 | Mn (kg/mol) | Mw (kg/mol) | Mz (kg/mol) | Mz/Mn | Mw/Mn | V1.0 (Pa·s) | V100 (Pa·s) |
| POE 407 | 0.87 | 30 | 7.5 | 23 | 49 | 83 | 3.6 | 2.1 | 3,153 | 1,231 |
| POE 200 | 0.87 | 5 | 7.5 | 34 | 751 | 130 | 3.8 | 2.2 | 15,165 | 2,674 |
| POE 661 | 0.88 | 18 | 7.1 | 22 | 51 | 90 | 4.1 | 2.3 | 5,643 | 1,402 |
| POE 150 | 0.868 | 0.5 | 7.8 | 57 | 130 | 239 | 4.2 | 2.3 | — | — |

Polymer Compositions

The polymer compositions are shown in Table 6. For each composition, the polymer pellets (98.25 wt"/©) were mixed with the curing additives (1.00 wt"/© peroxide, 0.50 wt % crosslinking coagent, and 0.25 wt % silane) in a sealable glass jar. The soaking process occurred via shaking and an overnight imbibition, until no liquid residuals were visually seen adhering to the glass jar. Afterwards, the imbibed sample was melt blended in RSI RS5000, RHEOMIX 600 mixer with CAM blades at 100° C./30 RPM for six minutes. The hot sample was cooled in a Carver press (cooled platens) at 20000 psi, for four minutes, to make a "pancake sample" for further testing.

Cure Properties

As seen in Table 6, the inventive compositions had excellent cure properties, as indicated by the high "MH-ML" values and high "Gel %" values. It has been discovered that the higher "Mz/Mn" values, and the presence of the high molecular weight fraction in the inventive compositions, allow the polymer to build up crosslinked network effectively during peroxide curing, which improves the deg/cc of cure.

Processability on Extruder

The processability of each alpha composition (see Table 2) was evaluated using a single screw extruder on a COLLIN cast film line. See Table 7. There were four zones in the barrel, and the heating elements on each temperature zones were turned off, to allow the alpha composition to be heated only from the shear-heating effect of the polymer, during the extrusion. The melt temperature of the alpha composition was directly monitored by a thermocouple, directly contacting the composition near the exit of the extruder die. Each composition was extruded at the maximum speed, at which the melt temperature of the composition reached 100±1° C., at the exit of the extruder. The composition was extruded for ten minutes at the maximum speed for stabilization, and then each zone temperature and the melt temperature at the extruder exit were recorded. In this case, a screw speed (RPM), above the maximum speed for each composition, will lead to an excessive shear-heating of the composition, and to a temperature above 100° C. In practical application, a "peroxide and coagent formulated" composition for PV encapsulant, at a temperature above 100° C., will be susceptible to undesired pre-mature curing. Also, the RPM of the extruder screw is proportional to the throughput rate of the extruder, and thus the alpha compositions that tolerate a higher RPM can be processed with a higher throughput rate during a PV encapsulant film fabrication. Here, the screw speed needed to be greater than 25 RPM to achieve a good throughput of the extruded composition.

Results

A summary of the processability and curing properties are shown in Table 8. As seen in Table 8, it was discovered that the inventive compositions provide an optimal balance of good processability and good cure properties. Both properties are key requirements for a useful "PV encapsulant." it has been discovered that each inventive composition has a very low shear viscosity at high shear rate (i.e., approx. 100 rad/s) at the film processing temperature (approx. 100° C.) due to its strong shear-thinning effect. Each inventive composition, therefore, has much less shear-heating at the same extrusion condition, as the less viscous polymer melt is more easily pushed through the extruder. Particularly, each composition has good processability in the extruder, such that the composition can tolerate higher RPM (>25 RPM) and thus higher throughput rates. It is noted that the Comparative Composition 4 (Table 7) did not meet "RPM>25" requirement, even though the composition had a relatively good curing efficiency. To avoid the potential scorching of the PV encapsulant, a composition's melt temperature through the extrusion process needs to be around, or lower than, 110° C., and thus each zone temperature should be less than 110° C. For most of the comparative examples, the speed of the extruder is limited to around 29 RPM or lower, to maintain lower melt temperatures throughout the extruder barrel. However, the inventive composition 2 reached as high as 37 RPM, which indicates a substantially improved resin processability window and a higher throughput rate. It was also discovered that each inventive composition can be effectively crosslinked, to offer a high level of curing (see MDR and gel % results in Table 6). While the comparative compositions (Comp. 1, Comp. 2, and Comp. 3) did meet the processability requirement, they could not reach a high curing state, as compared to the inventive compositions. This provides further indication that the inventive compositions offer an improved balance between the processability and the curing of a PV encapsulant, formed from the same. In several cases, the inventive compositions offer a similar or a higher level of curing, but at a substantially lower shear viscosity at 100 rad/s (for example, Inv. 1 vs. Comp. 4, and Inv. 2 vs. Comp. 2).

For the alpha compositions to satisfy the curing performance, it was also discovered that the composition needs to have a number averaged molecular weight $M_n \geq 16,000$ g/mol and V1.0 (100° C.)≥15,000 Pa·s. For Comp. 1, despite of its bimodal resin composition, the $M_n$ was only approx. 14,000 g/mol, due to the excessive amount of low molecular weight fraction in the composition. The excessive amount of low molecular weight species led to insufficient curing of the alpha composition.

In summary, it was discovered that the unique architecture of the inventive compositions allows for an improved balance between the processability of the composition and the curing of the composition, as compared to the comparative compositions, as discussed above. The inventive compositions will provide improved processability at comparable or higher curing levels, or improved curing levels at comparable or higher extrusion rates. Both good processability and high curing levels are important properties, valued by film producers in the PV encapsulant film industry. An inventive composition also provides good optical transparency and suitable modulus.

TABLE 6

Polymer Compositions (wt %)

| | Formulation | | | | | | | | | | | Curing Performance, 150° C. for 30 min | | |
|---|---|---|---|---|---|---|---|---|---|---|---|---|---|---|
| | POE A | POE B | POE C | Blend A | POE D | POE 407 | POE 661 | POE 200 | Peroxide | Coagent | Silane | MH-ML | ML | Gel % |
| Inv 1 | 98.25 | | | | | | | | 1.00 | 0.50 | 0.25 | 4.99 | 0.17 | 97 |
| Inv 2 | | 98.25 | | | | | | | 1.00 | 0.50 | 0.25 | 2.63 | 0.13 | 90 |
| Inv 3 | | | 98.25 | | | | | | 1.00 | 0.50 | 0.25 | 3.26 | 0.15 | 91 |
| Inv 4 | | | | 98.25 | | | | | 1.00 | 0.50 | 0.25 | 3.84 | 0.28 | 96 |
| Com 1 | | | | | 98.25 | | | | 1.00 | 0.50 | 0.25 | 2.07 | 0.13 | 87 |
| Com 2 | | | | | | 98.25 | | | 1.00 | 0.50 | 0.25 | 2.24 | 0.03 | 84 |
| Com 3 | | | | | | | 98.25 | | 1.00 | 0.50 | 0.25 | 2.74 | 0.05 | 85 |
| Com 4 | | | | | | | | 98.25 | 1.00 | 0.50 | 0.25 | 4.61 | 0.13 | 94 |

TABLE 7

Processability

| | Comp. 4 POE 200 | Comp. 3 POE 661 | Comp. 2 POE 407 | Inv. 3 POBC | Inv. 2 POE B | Comp. 1 POE D |
|---|---|---|---|---|---|---|
| Feed zone (° C.) | 18 | 18 | 18 | 19 | 19 | 19 |
| Zone 1 (° C.) | 68 | 74 | 68 | 69 | 68 | 69 |

TABLE 7-continued

| | Processability | | | | | |
|---|---|---|---|---|---|---|
| | Comp. 4 POE 200 | Comp. 3 POE 661 | Comp. 2 POE 407 | Inv. 3 POBC | Inv. 2 POE B | Comp. 1 POE D |
| Zone 2 (° C.) | 96 | 88 | 88 | 82 | 80 | 78 |
| Zone 3 (° C.) | 109 | 103 | 103 | 103 | 90 | 90 |
| Zone 4 (° C.) | 105 | 103 | 104 | 103 | 101 | 103 |
| Melt Temperature (° C.) | 100 | 100 | 100 | 100 | 101 | 101 |
| Screw speed (RPM) | 15 | 27 | 29 | 27 | 537 | 47 |
| V100 (Pa · s) | 2674 | 1402 | 1231 | 1643 | 908 | 898 |

TABLE 8

Processability/Cure Balance

| | Curing Processability Balance | |
|---|---|---|
| Composition | Good Processability | Good Cure Properties |
| Inv 1 | Yes | Yes |
| Inv 2 | Yes | Yes |
| Inv 3 | Yes | Yes |
| Inv 4 | Yes | Yes |
| Comp. 1 | Yes | No |
| Comp. 2 | Yes | No |
| Comp. 3 | Yes | No |
| Comp. 4 | No | Yes |

What is claimed is:

1. A composition comprising the following components a)-c):
   a) an alpha composition comprising a multimodal ethylene/alpha-olefin interpolymer, and wherein the alpha composition comprises the following properties:
   i) an Mz/Mn≥8.0,
   ii) a density from 0.855 to 0.890 g/cc,
   iii) a V100 (100° C.)≤2,000 Pa·s,
   iv) a V1.0 (100° C.)≥15,000 Pa·s,
   v) a Mn ≥16,000 g/mol;
   b) a peroxide; and
   c) a silane coupling agent.

2. The composition of claim 1, wherein the alpha composition has an I2≥1.0 g/10 min.

3. The composition of claim 1, wherein the alpha composition has an I2≤30 g/10 min.

4. The composition of claim 1, wherein the alpha composition has an I10/I2≥6.0.

5. The composition of any one of the previous claim 1, wherein the alpha composition has an I10/I2≤40.0.

6. The composition of any one of the previous claim 1, wherein, the alpha composition has a molecular weight distribution MWD≥3.00.

7. The composition of claim 1, wherein, for the multimodal interpolymer, a [$Mn_{(highest\ 20\%\ mass\ fraction)}$/$Mn_{(lowest\ 20\%\ mass\ fraction)}$]≥16.0.

8. The composition of claim 1, wherein, for the multimodal interpolymer, a [$Mn_{(highest\ 20\%\ mass\ fraction)}$/$Mn_{(lowest\ 20\%\ mass\ fraction)}$]≤100.0.

9. The composition of claim 1, wherein the multimodal ethylene/alpha-olefin interpolymer comprises a first ethylene/alpha-olefin interpolymer fraction and a second ethylene/alpha-olefin interpolymer fraction, and wherein the first ethylene/alpha-olefin interpolymer fraction differs from the second ethylene/alpha-olefin interpolymer fraction in one or more properties selected from comonomer content, I2, I10/I2, Mn, Mw, Mz, MWD, or any combination thereof.

10. The composition of claim 9, wherein the first ethylene/alpha-olefin interpolymer fraction is a first ethylene/alpha-olefin copolymer, and wherein the second ethylene/alpha-olefin interpolymer fraction is a second ethylene/alpha-olefin copolymer.

11. The composition of claim 1, wherein the composition comprises ≥50.0 wt % of the alpha composition, based on a weight of the composition.

12. The composition of claim 1, wherein the alpha composition further comprises a unimodal ethylene/alpha-olefin interpolymer that has a MWD from 1.80 to 2.50, and a density from 0.860 to 0.890 g/cc.

13. The composition of claim 1, wherein a weight ratio of the peroxide to the silane coupling agent is from 0.5 to 7.0.

14. The composition of claim 1, wherein the composition further comprises a crosslinking coagent.

15. The composition of claim 14, wherein a weight ratio of the peroxide to the coagent is from 0.5 to 3.0.

16. A crosslinked composition formed from the composition of claim 1.

17. An article comprising at least one component formed from the composition of claim 1.

18. The article of claim 17, wherein the article is a film.

19. The article of claim 17, wherein the article is a solar cell module.

20. A process of forming a solar cell module, said process comprising laminating an array of solar cells between two film layers, and wherein each film layer is, independently, formed from the composition of claim 1.

* * * * *

UNITED STATES PATENT AND TRADEMARK OFFICE
CERTIFICATE OF CORRECTION

PATENT NO. : 12,281,186 B2
APPLICATION NO. : 17/773569
DATED : April 22, 2025
INVENTOR(S) : Wu et al.

Page 1 of 1

It is certified that error appears in the above-identified patent and that said Letters Patent is hereby corrected as shown below:

In the Claims

Column 25, Claim 5, Line 47 should read: The composition of claim 1,

Column 25, Claim 6, Line 49 should read: The composition of claim 1,

Signed and Sealed this
Ninth Day of December, 2025

John A. Squires
*Director of the United States Patent and Trademark Office*